United States Patent [19]
Hesson et al.

[11] Patent Number: 5,136,357
[45] Date of Patent: Aug. 4, 1992

[54] LOW-NOISE, AREA-EFFICIENT, HIGH-FREQUENCY CLOCK SIGNAL DISTRIBUTION LINE STRUCTURE

[75] Inventors: James H. Hesson; Gregory N. Roberts, both of Boise, Id.

[73] Assignee: Micron Technology, Inc., Boise, Id.

[21] Appl. No.: 683,767

[22] Filed: Apr. 10, 1991

Related U.S. Application Data

[63] Continuation-in-part of Ser. No. 517,467, Apr. 26, 1990, abandoned, which is a continuation of Ser. No. 371,320, Jun. 26, 1989, abandoned.

[51] Int. Cl.$^5$ .................... H01L 27/02; H01L 23/48; H01L 25/04
[52] U.S. Cl. ........................ 357/51; 357/40; 357/65; 357/84
[58] Field of Search ............. 357/51, 40, 65, 84

[56] References Cited

U.S. PATENT DOCUMENTS

| | | | |
|---|---|---|---|
| 3,886,458 | 5/1975 | Matsumoto et al. | 357/51 |
| 3,953,875 | 4/1976 | Cave et al. | 357/51 |
| 4,211,941 | 7/1980 | Schade, Jr. | 357/51 |
| 4,214,252 | 7/1980 | Goerth | 357/51 |
| 4,654,689 | 3/1987 | Fujii | 357/51 |
| 4,737,830 | 4/1988 | Patel et al. | 357/51 |
| 4,774,559 | 9/1988 | Culican et al. | 357/51 |
| 5,008,731 | 4/1991 | Van DeGrift et al. | 357/65 |

FOREIGN PATENT DOCUMENTS 62-94956  5/1987  Japan ........................ 357/51

*Primary Examiner*—J. Carroll
*Attorney, Agent, or Firm*—Angus C. Fox, III

[57] ABSTRACT

An area-efficient, low-noise transmission line structure for use in integrated circuits, which may be used to carry a high-frequency AC signal from a source location to one or more destination locations. This transmission line structure effectively decouples high-frequency signals carried by a signal line from a subjacent substrate. The structure comprises a dielectric layer subjacent the entire length of the signal line, a well of semiconductor material having a conductivity type opposite to that of the substrate, with the well being positioned beneath the signal line, extending substantially the entire distance between the source location and each destination location, being electrically insulated from the signal line by the dielectric layer, and forming a P-N junction with the substrate. The junction, which is maintained in a reverse-biased state, possesses a parasitic capacitance that is larger than the parasitic capacitance existing between the signal line and the well. The reverse-biased state is maintained by application of a biasing voltage applied through ohmic contact made to one or more heavily-doped diffusion regions, which extend the length of the well and are of the same conductivity type as the well.

12 Claims, 4 Drawing Sheets

LOW-NOISE, AREA-EFFICIENT, HIGH-FREQUENCY CLOCK SIGNAL DISTRIBUTION LINE STRUCTURE

This application is a continuation-in-part of application Ser. No. 07/517,467 that was filed on Apr. 26, 1989, and which was a continuation of now-abandoned application Ser. No. 07/371,320 that was filed on Jun. 26, 1989.

FIELD OF THE INVENTION

This invention relates to integrated circuits (ICs) and, more specifically, to clock signal distribution networks that are designed so as to minimize disruptive substrate noise that would normally be associated with a high-frequency clock signal.

BACKGROUND OF THE INVENTION

Elements of an electronic circuit are integrated into the surface of a wafer (made of a semiconductor material such as silicon) by a series of well-known photographic and chemical processes. The resulting monolithic integrated circuit (IC for short) is a very tiny, yet functional, electronic circuit. As ICs have been made smaller, faster, and more complex, problems that, for early generations of ICs, were considered insignificant, have become major impediments to further increases in IC performance.

A monolithic integrated circuit typically contains a multitude of electrical devices and numerous lines interconnecting those devices. In such a circuit, a dielectric layer such as silicon dioxide or silicon nitride effectively isolates a DC signal line from the substrate. However, pulsating DC and AC signals are much more common than DC signals in integrated circuits. If a line carries a fluctuating signal, whether it be an alternating current signal, such as a clock signal, or pulsating direct current, the signal will, to some extent, be capacitively coupled as unwanted noise into the substrate. In certain circuits such as microprocessor circuits, four or more different AC clock signal lines and a multitude of other lines carrying fluctuating signals may be routed to various devices throughout the entire circuit. Additionally, when driver output impedances are closely matched with device input impedances, high current flow through clock signal lines is a given. This fact, coupled with increasing processor cycle frequencies (frequencies of 40 MHz and above have been announced), provides ample opportunity for noise generation if signal lines are not adequately isolated from the rest of the circuit. This noise will likely be carried by the substrate into nearby circuitry, often with unpredictable results, causing circuit malfunctions such as mistriggering. The higher the clock signal, the greater the potential for introduction of noise into the substrate. Noise problems tend to be extremely difficult to pinpoint, and even more difficult to solve.

In the graphic statement of the problem of FIG. 1, three signal lines 11, 12 and 13 are shown in a simplified circuit example. The signal lines, are insulated from a P-type substrate 14 by a dielectric layer 15. A single transistor N-channel transistor 16 having a multi-layer gate electrode 17 and a silicon dioxide gate dielectric layer 18, is located at the edge of silicon dioxide field isolation dielectric layer 15. It is well known in the art of semiconductor manufacture that silicon dioxide gate dielectric layers generally have thicknesses ranging from 50 to 200 Å, whereas silicon dioxide field isolation dielectric layers are typically at least an order of magnitude (i.e., ten times) thickner than the gate dielectric layers. As an AC or pulsating DC signal in line 12, for example, rapidly varies in voltage, the signal will, to some extent, be capacitively coupled into substrate 14 as an unwanted noise voltage. In a typical microprocessor circuit, total signal line area can easily be more than 100 times the size of the area of a bond pad. Thus, the unwanted capacitive effect of a signal line can be substantial. The noise voltage will be propagated through the distributed R-C network 17 the substrate and will then be coupled into nearby transistors or junctions. Performance of the transistors or junctions may be adversely affected as a result. In the illustrated example, transistor 16 may be sufficiently close to signal line 12 to be affected by capacitive coupling.

Referring now to a representative clock signal distribution network within a monolithic circuit depicted in FIG. 2, a clock oscillator 21 acts as the primary signal source point, which branches via multiple conductive signal lines 22, to various primary destination points within the circuit. Such primary destination points, which usually incorporate a line driver, may, in turn, function as secondary signal source points, each branching via additional signal lines 22 to secondary destination points within the circuit. The branching process may continue even further. Source points (without regard to whether they are primary or secondary) are designated by the letter "S", while destination points (without regard to whether they are primary or secondary) are designated by the letter "D".

One method of ameliorating the problem of high-frequency-induced noise in the substrate is to simply ground the substrate. This cannot be a solution, however, when as is commonly the case, a particular design requires that the substrate be held at a negative potential.

Another method of dealing with the problem of substrate noise is to use distance to attenuate the noise by locating sensitive circuitry far enough away from the lines carrying AC signals that the noise is eliminated or at leaded reduced to tolerable levels at the sensitive location. However, this approach is incompatible with the ongoing trends of circuit miniaturization and ever-faster clock speeds. An area-efficient AC transmission line structure that decouples noise from the substrate is needed.

SUMMARY OF THE INVENTION

This invention provides a semiconductor structure for capacitively decoupling a signal line, which runs from a source location to one or more destination locations, from a subjacent substrate. The structure, which can be created within a monolithic integrated circuit using conventional fabrication techniques, comprises a field isolation dielectric layer subjacent the entire length of the signal line, a well of semiconductor material having a conductivity type opposite to that of the substrate, with the well being positioned beneath the signal line, extending substantially the entire distance between the source location and each destination location, being electrically insulated from the signal line by the field isolation dielectric layer, and forming a P-N junction with the substrate. The junction, which is maintained in a reverse-biased state, possesses a parasitic capacitance that is larger than the parasitic capacitance existing between the signal line and the well. The reverse-biased state is maintained by application of a biasing voltage applied through ohmic contact made to one or more heavily-doped diffusion regions, which extend the length of the well and are of the same conductivity type as the well. A capacitive voltage divider is effectively made, which shunts a majority of the current capacitively induced in the well into the source of the biasing voltage.

PREFERRED EMBODIMENT OF THE INVENTION

In this disclosure, "N" denotes silicon that has been dopes with atoms having more than four valence electrons, introducing negative majority charge carriers, and "P" denotes silicon that has been doped with atoms having less than four valence electrons, introducing positive majority charge carriers. The majority charge carrier type is alreffered to as conductivity type. A plus or minus after an N or P indicates heavy or light relative doping concentration, respectively.

Figure 3:
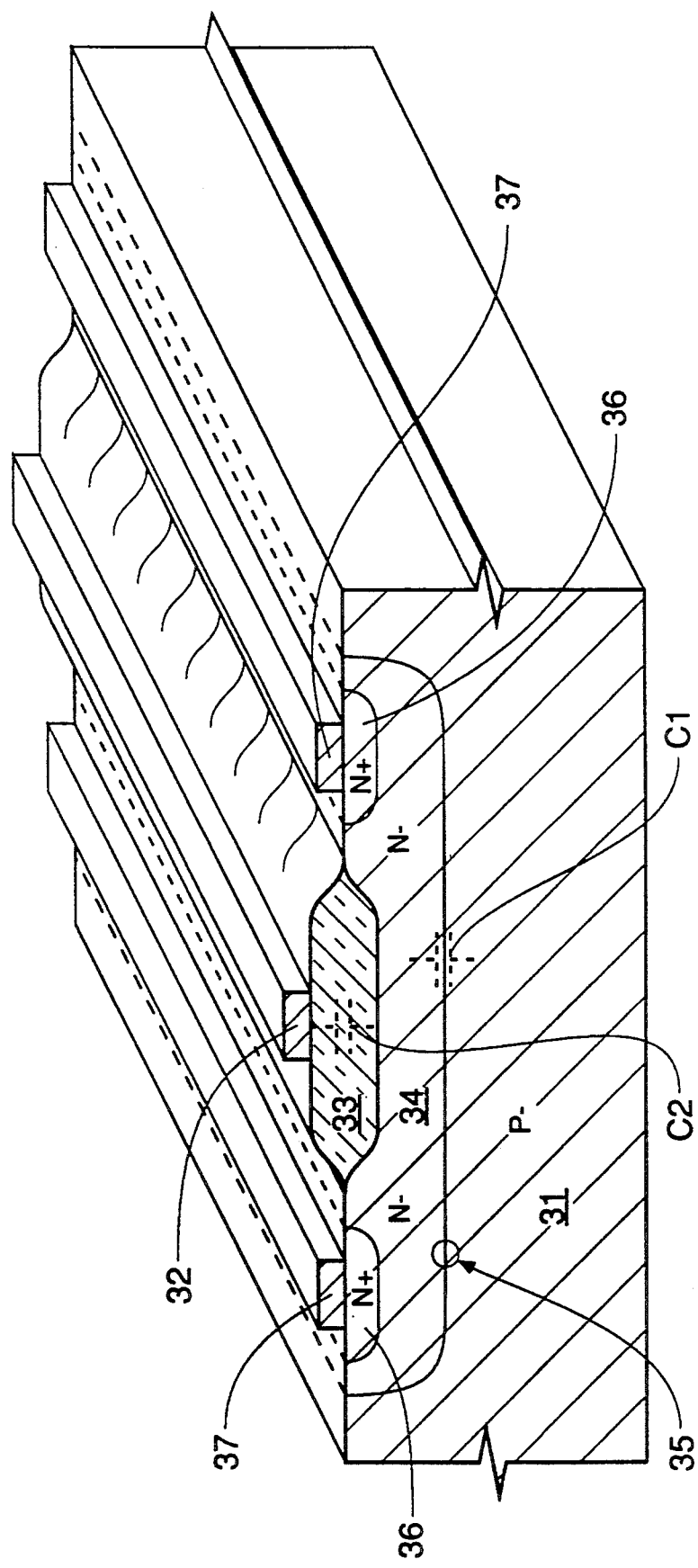
FIG. 3 is a cross-sectional/isometric view of a clock signal distribution line which incorporates the preferred embodiment capacitive decoupling structure.

Referring now to FIG. 3, in the preferred embodiment of the invention, a monolithic integrated circuit is fabricated on a semiconductor substrate 31. A conductive signal line 32 (e.g., an aluminum strip) runs from a source location within the circuit to one or more destination locations within the circuit. The decoupling structure comprises a field isolation dielectric layer 33 subjacent the entire length of signal line 32, a well 34 of semiconductor material having a conductivity type opposite to that of the substrate 31, with the well being positioned beneath the signal line 32, extending substantially the entire distance between the source location and each destination location, being electrically insulated from signal line 32 by field isolation dielectric layer 33, and forming a P-N junction 35 with substrate 31. Junction 35, which is maintained in a reverse-biased state, possesses a first parasitic capacitance $C_1$ that is larger than a second parasitic capacitance $C_2$ existing between signal line 32 and well 34. Junction 35 is maintained in a reverse-biased state by means of ohmic contact made to one or more N+diffusion regions 36 within well 34. A heavily-doped diffusion region 36, having the same conductivity type as well 34, is located on each side of field isolation dielectric layer 33, each extending the length of well 34. A biasing voltage is applied to each of the heavily-doped diffusion regions through ohmic contact made via a metal strip 37 that is coextensive with and superjacent each heavily-doped diffusion region 36. Although in FIG. 3, substrate 31 is depicted as being of P-type semiconductor material and well 34 and heavily-doped diffusion region 36 are depicted as being of N-type material, a workable structure may be created using the opposite material types for each component. For the depicted embodiment, the application of a positive voltage to well 34 is required to maintain junction 35 in a reverse-biased state, whereas for the undepicted embodiment (constructed using opposite material types), a negative voltage is required to maintain junction 35 in a reverse-biased state. It should be recognized that the cross-sectional view depicted in FIG. 3 is representative of a cross-sectional view taken at any point along the length of conductive line 32.

Figure 1:
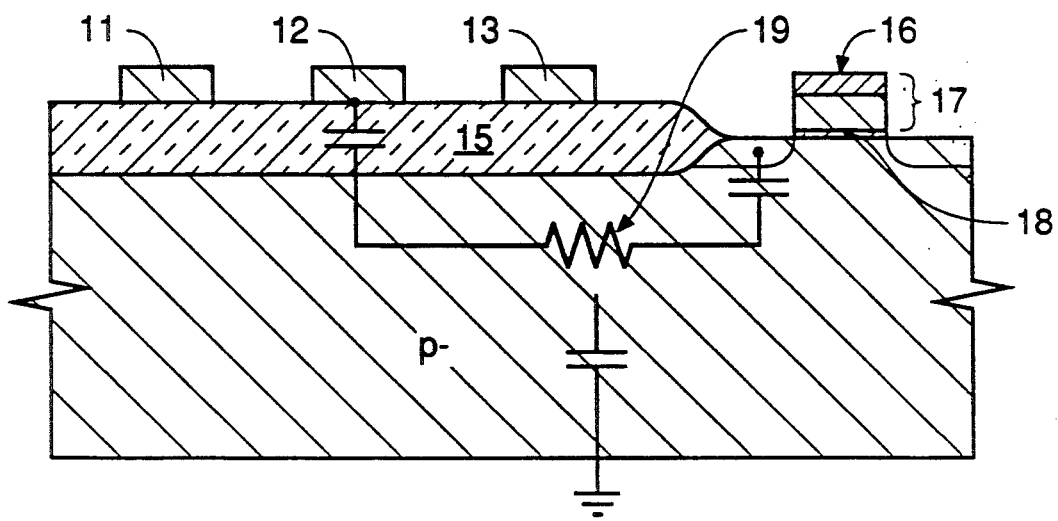
FIG. 1 is a graphic statement of the problem.
Figure 2:
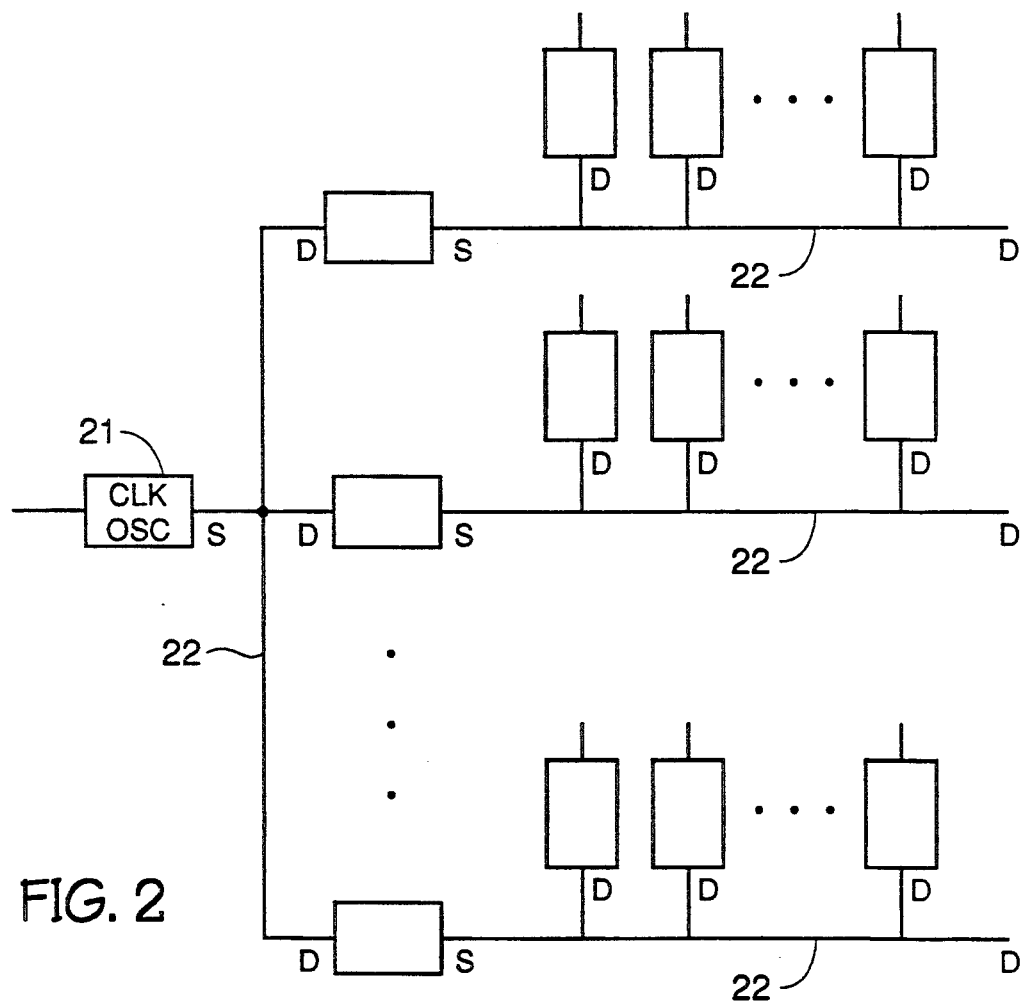
FIG. 2 is a block diagram showing a typical clock signal distribution network in a monolithic microprocessor circuit.
Figure 4:
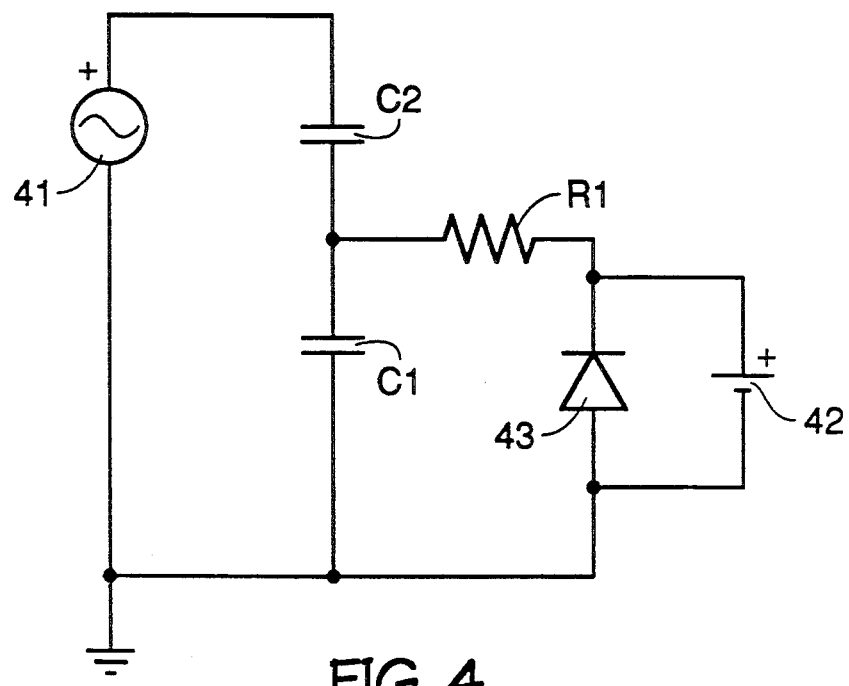
FIG. 4 is an equivalent circuit diagram of the semiconductor structure depicted in FIG. 3.

Referring now to FIG. 4, which is an equivalent circuit diagram of the semiconductor structure depicted in FIG. 3, a pulsating DC or an alternating signal 41 is applied between the lower plate of capacitor $C_1$ (which is equivalent to the lightly-doped P-type substrate 31 of FIG. 3) and the upper capacitor plate of capacitor $C_2$ (which is equivalent to conductive signal line 32 of FIG. 3). The dielectric of capacitor $C_2$ is the field isolation dielectric layer 33 of FIG. 3. N-well 34 of FIG. 3 acts as the lower capacitor plate of capacitor $C_2$, as well as the upper capacitor plate of capacitor $C_1$. The lower capacitor plate of capacitor $C_2$ and the upper capacitor plate of capacitor $C_1$ (once again equivalent to N-well 34 of FIG. 2) are tied to both a positive voltage source 42 and a diode 43 (which is equivalent to the reverse-biased junction 35 of FIG. 3). If semiconductor materials of opposite conductivity types were used, voltage source 42 would be a negative voltage source and the polarity of diode 43 would be reversed. The capacitance of $C_2$ is on the order of $10^{-4}$ pF/m$^2$. Capacitances $C_1$ and $C_2$, together, form a voltage divider, which shunts a majority of the current capacitively induced in well 34 into voltage source 42. Although the lower plate of capacitor $C_1$ (substrate 31 of FIG. 3) is shown as being grounded, it may be either grounded or floating. Resistor R1 is minimized by making ohmic contact to the N+diffusion regions (item 36 of FIG. 3) throughout their length via metal strips (item 37 of FIG. 3).

Figure 5:
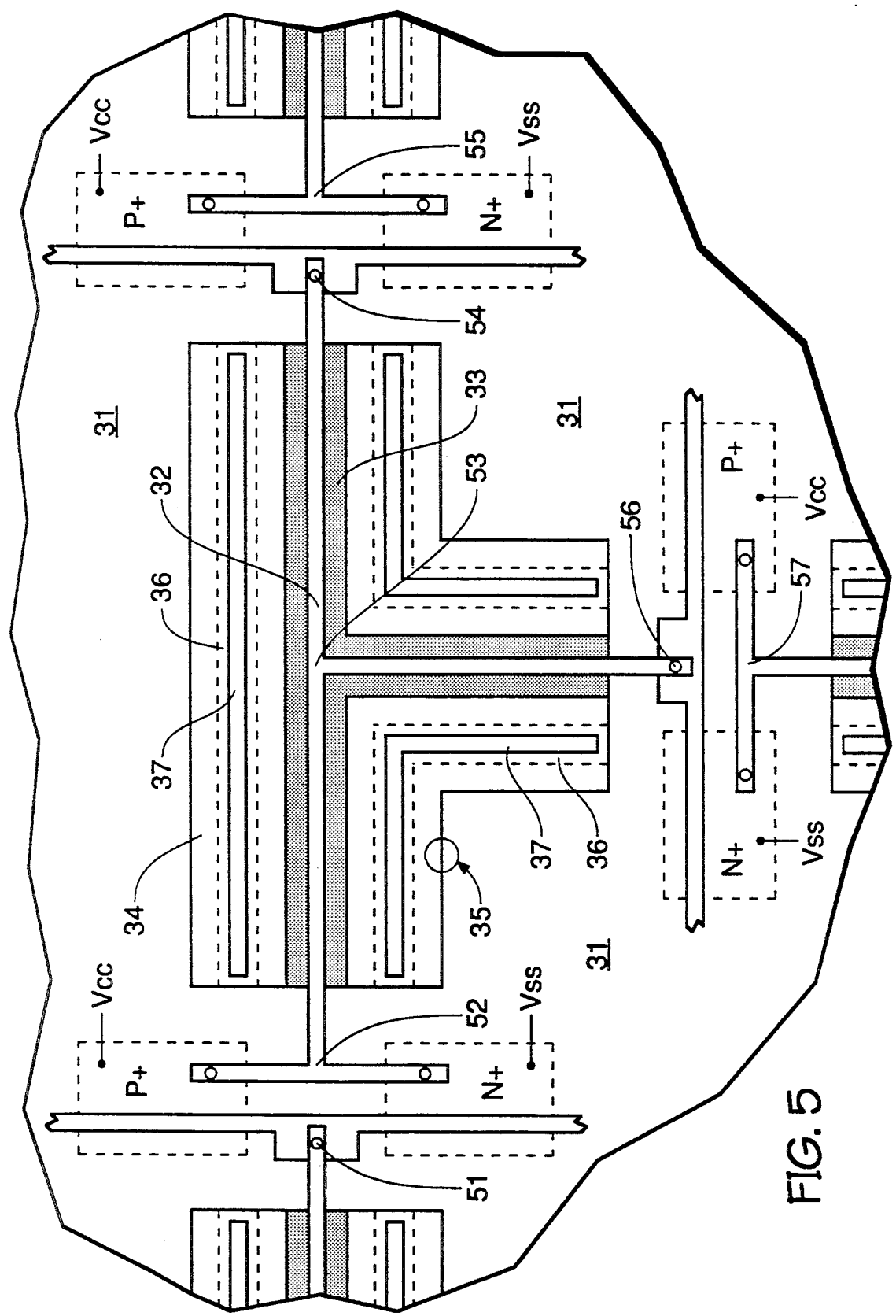
FIG. 5 is a top planar view of the preferred embodiment clock signal distribution line structure connecting an output from a first line driver with the inputs of second and third line drivers.

Referring now to FIG. 5, an example of the preferred embodiment of the clock signal distribution line is shown, which connects a first line driver (inverter) output 52 (which functions as a signal source point) with the inputs of a second line driver input 54 and third line drier input 56 (both of which functions as signal destination points). It will be noted that the first line driver is fed by an identical preferred embodiment structure via input 51. Second and third line drivers drive additional clock signal distribution line extensions via outputs 55 and 57, respectively. In order to show the layout of the decoupling structure at a branch point, signal line 32 is depicted as branching at point 53. Point 53 thus serves as a beginning, or source point, for a continuation of the preferred embodiment structure en route to the second and third line drivers. Equivalent structural components of FIGS. 3 and 5 are numbered identically. It will be noted that the ends of signal lines 32 extend beyond the limits of well 34 so as to allow isolation between the well and the driver devices to which signal lines 32 are connected.

Although only a single embodiment of the area-efficient clock distribution line structure has been disclosed herein, it will be apparent to one having ordinary skill in the art, that changes may be made thereto without departing from the spirit and the scope of the invention as claimed. For example, conductivity types and voltage polarities may be reversed, dielectrics other than silicon nitride or silicon dioxide may be used, and other semiconductor materials such as germanium or gallium arsenide may be substituted for silicon.

We claim:

1. In a monolithis integrated circuit fabricated on a substrate of a first conductivity type, a semiconductor structure for distributing a signal characterized by a rapidly fluctuating voltage from at least one source location within said circuit to at least one destination location within said circuit with minimal capacitive coupling of said signal to the substrate, said structure comprising the following elements:
- a well of a second conductivity type within said substrate, said well having a length which spans substantially the entire distance between said source location and said destination location, and also having a width that completely underlies the remaining elements of the structure, except as hereinafter specified;
- a field isolation dielectric layer which overlies a central portion of the width of said well, said dielectric layer extending at least the entire length of said well and being in intimate contact therewith;
- a conductive line for carrying said signal from said source location to said destination location, said conductive line being both superjacent said dielectric layer, and completely insulated from said well by said dielectric layer, the ends of said conductive line extending beyond the limits of the length of said well so as to allow isolation between said well and devices at said source and destination locations; and
- a heavily-doped diffusion region of said second conductivity type on each side of said field isolation dielectric layer, to which a biasing voltage is applied in order to maintain said junction in a reversed-biased state, each of said diffusion regions being located with an outer portion of said well that does not underlie said field isolation dielectric layer.

2. The semiconductor structure of claim 1, wherein said field isolation dielectric layer is silicon dioxide.

3. In a monolithis integrated circuit fabricated on a substrate of a first conductivity type, a semiconductor structure for distributing a signal characterized by a rapidly fluctuating voltage from at least one source location within said circuit to at least one destination location within the circuit with minimal capacitive coupling of said signal to said substrate, said structure comprising the following elements:
- a well of a second conductivity type within said substrate, said well having a length which spans substantially the entire distance between said source location and said destination location, and also having a width that completely underlies the remaining elements of the structure, except as hereinafter specified, said well forming a junction having a first parasitic capacitance with said substrate;
- a field isolation dielectric layer which overlies a portion of the width of said well, said dielectric layer extending at least the entire length of said well and being in intimate contact therewith;
- a conductive line for carrying said signal from said source location to said destination location, said conductive line being both superjacent said dielectric layer, and completely insulated from said well by said dielectric layer, the ends of said conductive line extending beyond the limits of the length of said well so as to allow isolation between said well and devices at said source and destination locations; and
- at least one heavily-doped diffusion region of said second conductivity type to which a biasing voltage is applied in order to maintain said junction in a reverse-biased state, said diffusion region located within that portion of said well which is not overlaid with said dielectric layer.

4. The semiconductor structure of claim 3, wherein said first parasitic capacitance is greater than a second parasitic capacitance existing between said conductive line and said well.

5. The semiconductor structure of claim 4, wherein said first and second parasitic capacitances together form a voltage divider which reduces signal-induced noise transmitted from said conductive line to the substrate.

6. The semiconductor structure of claim 5, wherein said field isolation dielectric layer is silicon dioxide.

7. The semiconductor structure of claim 6, wherein said heavily-doped diffusion region is located adjacent a single longitudinal edge of said dielectric layer, and extends substantially the entire length of said well.

8. The semiconductor structure of claim 7, which further comprises a conductive strip superjacent to, in intimate contact with, and coextensive with said heavily-doped diffusion region.

9. The semiconductor structure of claim 8, wherein said conductive line and said conductive strip are metal.

10. The semiconductor structure of claim 6, wherein a heavily-doped diffusion region is located adjacent both longitudinal edges of said dielectric layer, diffusion region extending substantially the entire length of said well.

11. The semiconductor structure of claim 10, which further comprises a conductive strip superjacent to, in electrical communication with, and coextensive with each heavily-doped diffusion region.

12. The semiconductor structure of claim 11, wherein said conductive line and both conductive strips are metal.

* * * * *

UNITED STATES PATENT AND TRADEMARK OFFICE
CERTIFICATE OF CORRECTION

PATENT NO. : 5,136,357

DATED : August 4, 1992

INVENTOR(S) : J. Hesson et al.

It is certified that error appears in the above—identified patent and that said Letters Patent is hereby corrected as shown below:

Column 2, line 3, delete "thickner" and insert -- thicker --.

Column 4, line 43, delete "drier" and insert -- driver --.

Column 5, line 2, delete "monolithis" and insert -- monolithic --.

Column 5, line 40, delete "monolithis" and insert -- monolithic --.

Signed and Sealed this

First Day of February, 1994

Attest:

BRUCE LEHMAN

Attesting Officer

Commissioner of Patents and Trademarks